United States Patent
Yang et al.

(10) Patent No.: US 9,871,195 B1
(45) Date of Patent: Jan. 16, 2018

(54) SPACER ASSISTED ION BEAM ETCHING OF SPIN TORQUE MAGNETIC RANDOM ACCESS MEMORY

(71) Applicant: Headway Technologies, Inc., Milpitas, CA (US)

(72) Inventors: Yi Yang, Fremont, CA (US); Dongna Shen, San Jose, CA (US); Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/465,644

(22) Filed: Mar. 22, 2017

(51) Int. Cl.
*H01L 43/12* (2006.01)
*H01L 43/08* (2006.01)
*H01L 43/02* (2006.01)

(52) U.S. Cl.
CPC .............. *H01L 43/12* (2013.01); *H01L 43/02* (2013.01); *H01L 43/08* (2013.01)

(58) Field of Classification Search
CPC ......... H01L 43/12; H01L 43/02; H01L 43/08; G01R 33/098; G11B 5/3909
See application file for complete search history.

(56) References Cited

U.S. PATENT DOCUMENTS

| | | | |
|---|---|---|---|
| 6,897,532 B1 * | 5/2005 | Schwarz | B82Y 25/00 257/367 |
| 8,981,502 B2 * | 3/2015 | Chen | H01L 43/08 257/247 |
| 9,306,158 B2 * | 4/2016 | Tsai | H01L 43/08 |
| 9,705,071 B2 * | 7/2017 | Annunziata | H01L 43/02 |
| 2006/0132983 A1 | 6/2006 | Osugi et al. | |
| 2012/0012952 A1 | 1/2012 | Chen et al. | |
| 2015/0061052 A1 * | 3/2015 | Huang | H01L 43/08 257/421 |
| 2016/0020386 A1 | 1/2016 | Kim et al. | |
| 2016/0211441 A1 | 7/2016 | Deshpande et al. | |
| 2016/0225979 A1 * | 8/2016 | Hsu | H01L 43/08 |
| 2017/0025603 A1 | 1/2017 | Ham | |

* cited by examiner

*Primary Examiner* — Michael Trinh
(74) *Attorney, Agent, or Firm* — Saile Ackerman LLC; Stephen B. Ackerman; Rosemary L. S. Pike

(57) ABSTRACT

A stack of MTJ layers is provided on a substrate comprising a bottom electrode, a pinned layer, a tunnel barrier layer, a free layer, and a top electrode. The MTJ stack is patterned to form a MTJ device wherein sidewall damage is formed on its sidewalls. A dielectric spacer is formed on the MTJ device. The dielectric spacer is etched away on horizontal surfaces wherein the dielectric spacer on the sidewalls is partially etched away. The remaining dielectric spacer covers the pinned layer and bottom electrode. The dielectric spacer is removed from the free layer or is thinner on the free layer than on the pinned layer and bottom electrode. Sidewall damage is thereafter removed from the free layer by applying a horizontal etching to the MTJ device wherein the pinned layer and bottom electrode are protected from etching by the dielectric spacer layer.

20 Claims, 1 Drawing Sheet

SPACER ASSISTED ION BEAM ETCHING OF SPIN TORQUE MAGNETIC RANDOM ACCESS MEMORY

TECHNICAL FIELD

This application relates to the general field of magnetic tunneling junctions (MTJ) and, more particularly, to etching methods for forming MTJ structures.

BACKGROUND

Fabrication of magneto-resistive devices normally involves a sequence of processing steps during which many layers of metals and dielectrics are deposited and then patterned to form a magneto-resistive stack as well as electrodes for electrical connections. The magneto-resistive stack usually includes the free and pinned layers of the device, sandwiched around one or more dielectric layers functioning as the tunnel junction for the magnetic tunnel junction (MTJ) device. To define those millions of MTJ cells in each magnetic random access memory (MRAM) device and make them non-interacting to each other, precise patterning steps including RIE (reactive ion etching) are usually involved. During RIE, high energy ions remove materials vertically in those areas not masked by photoresist, separating one MTJ cell from another.

However, the high energy ions can also react with the non-removed materials laterally. For MTJ cells, this lateral reaction can form a damaged portion by oxygen, moisture and other chemicals on the sidewall, lowering the magneto-resistance ratio and coercivity. This damage is cell size dependent, meaning it becomes more severe when the cell size decreases for the future sub-nano node products. To solve this issue, pure physical etching techniques such as ion beam etching (IBE) have been applied to trim the surface of the MTJ stack to remove the damaged portion. However when trimmed by IBE directly, the volumes of the free layer and pinned layer decrease together, making the latter's size too small to stabilize the internal magnetic state, resulting in a smaller energy barrier and larger switching current. In addition, due to their non-volatile nature, IBE trimmed ferromagnetic materials in the pinned layer and bottom electrode can be re-deposited into the free layer and top electrode, resulting in shorted devices.

Several references teach methods to remove sidewall damage. These include U.S. Patent Applications 2017/0025603 (Nara), 2016/0020386 (Kim et al), and 2006/0132983 (Osugi et al). Other references teach methods of blocking material diffusion into a pinned layer. These include U.S. Patent Application 2016/0211441 (Deshpande et al) and U.S. Patent Application 2012/0012952 (Chen et al). All of these references are different from the present disclosure.

SUMMARY

It is an object of the present disclosure to provide an improved method of forming MTJ structures.

Yet another object of the present disclosure is to provide a method of removing sidewall damage from the free layer while protecting the pinned layer in the fabrication of MTJ devices.

In accordance with the objectives of the present disclosure, a method for etching a magnetic tunneling junction (MTJ) structure is achieved. A bottom electrode is provided on a substrate. A stack of MTJ layers is deposited on the bottom electrode comprising, in order, a pinned layer, a tunnel barrier layer, and a free layer. A top electrode is provided on the stack of MTJ layers. The top electrode, MTJ stack, and bottom electrode are patterned to form a MTJ device wherein sidewall damage is formed on sidewalls of the MTJ device. A dielectric spacer is conformally deposited over the substrate and MTJ device. The dielectric spacer layer is etched away on horizontal surfaces of the substrate and MTJ device to form a tapered spacer wider on the bottom electrode and narrower or absent on the free layer wherein the tapered spacer covers the pinned layer and bottom electrode. Thereafter, sidewall damage is removed from the free layer by applying a horizontal physical etching to the MTJ device wherein the pinned layer and bottom electrode are protected from the physical etching by the dielectric spacer layer.

BRIEF DESCRIPTION OF THE DRAWINGS

In the accompanying drawings forming a material part of this description, there is shown.

DETAILED DESCRIPTION

In the present disclosure, ion beam etching (IBE) is applied to trim the surface of the MTJ stack to remove the damaged portion. In this method, only the free layer is trimmed but the volume of the pinned layer remains the same. This way, the pinned layer will not be too small to stabilize the internal magnetic state. Furthermore, the sidewall re-deposition can be completely eliminated to enable the IBE or RIE+IBE process to be used for the MRAM chip manufacture process.

In this invention, we introduce a dielectric layer that has no or less coverage on the top free layer than the bottom pinned layer and electrode. This ensures that during the following IBE trimming process, only the damage within the free layer is removed but the pinned layer and bottom electrode stay intact. Since the size of MTJ cells is determined by the size of the free layer, we are able to remove all the damaged portion responsible for the decreased performance at small sizes while ensuring that the size of the pinned layer is large enough to stabilize the magnetic state. Furthermore, there are no re-deposition induced shorted devices. The concept of utilizing this non-uniformly distributed dielectric on the MTJ is the novel feature of this disclosure.

Figure 1:
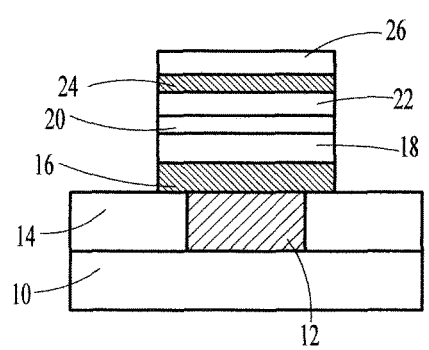
FIGS. 1 through 4 illustrate in cross-sectional representation steps in a preferred embodiment of the present disclosure.

Referring now to FIGS. 1 through 4, the novel method will be described in detail. The process begins with a traditional MTJ etching process. Referring now more particularly to FIG. 1, there is shown a bottom electrode 16 formed on the substrate 10 having metal via 12 and insulation layer 14 formed therein. Now, layers are deposited on the bottom electrode to form a magnetic tunnel junction. For example, pinned layer 18, tunnel barrier layer 20, and free layer 22 are deposited followed by top electrode 24. There may be one or more pinned, barrier, and/or free layers. Finally a hard mask layer 26 is deposited on the top electrode.

Using a photoresist process, the MTJ stack is etched, such as by RIE, IBE or a mixed RIE/IBE process, forming a uniform size of top electrode, free layer, tunnel barrier, pinned layer and bottom electrode, as shown in FIG. 1.

After the MTJ etching process, the wafer will be unloaded from the etcher tool and exposed to the atmosphere. The MTJ sidewall can be damaged either during the etching process or by exposure to the atmosphere causing sidewall oxidation. The sidewall damage will lead to lower MR ratio and worse magnetic properties (lower coercivity (Hc), lower energy barrier (Eb), higher critical writing current (Ic), higher critical writing voltage (Vc)) and also will induce non-uniformity of electric and magnetic performance. This kind of sidewall damage will worsen especially as the MTJ size decreases.

Figure 2:
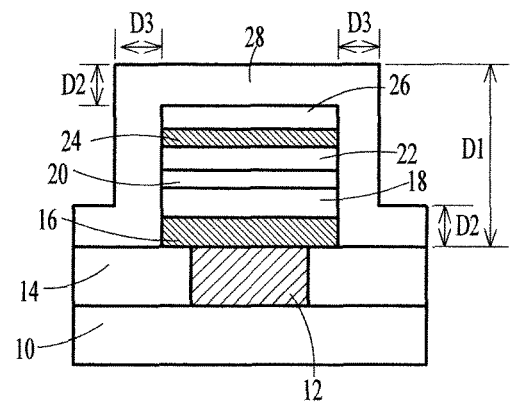

A novel process to remove the sidewall damage without decreasing the size of the pinned layer is now described. A spacer 28 is deposited onto the patterned MTJ stack, as illustrated in FIG. 2. The spacer may be a hard mask dielectric material such as SiON, SiN and SiO2 and have a thickness of between about 10 and 500 nm.

Figure 3:
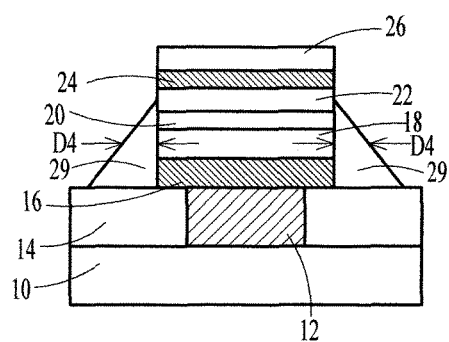

Next, as illustrated in FIG. 3, the dielectric on the top and bottom parts of the MTJ stack is vertically etched away by RIE or IBE. Because of the larger dielectric thickness D1 along the sidewalls than the thickness D2 over the hard mask 28 and the substrate layer 14, the vertical RIE or IBE will etch away all of the dielectric layer 28 on top of the hard mask and the substrate and will also etch away or thin only the portion of the sidewall spacer 28 covering the upper layers of the MTJ stack including the top electrode and the free layer. This is, the resulting spacers 29 are tapered so that they are wider at the bottom of the stack and narrower at the top of the stack. This non-uniform sidewall coverage 29, illustrated in FIG. 3, is the key feature of the present disclosure. RIE etching is usually done with a vertical angle of 0. IBE etching can cover a range of angles from 0 to 40 degrees, depending on the feature size and device density. The process can be stopped by time or endpoint detection.

In an existing process, IBE is applied to MTJ patterns directly to trim away the damaged portion. The size of the whole MTJ stack including the free layer and pinned layer decreases during the process. At some point the pinned layer would become too small to maintain its internal magnetic state. Additionally since the IBE process is a pure physical etching process without selectivity, the re-deposition of pinned layer and bottom electrode material cannot be avoided.

Figure 4:
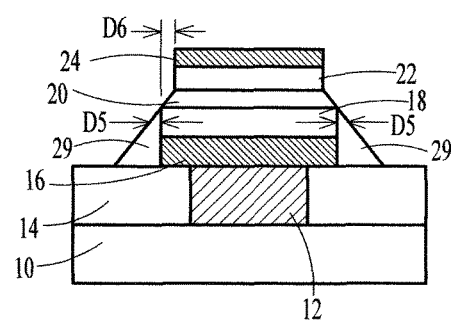

In the process of the present disclosure, because of the patterned spacer 29, the IBE trimming step, shown in FIG. 4, etches away only the damaged portion within the free layer, leaving the pinned layer and bottom electrode intact and avoiding the problems described above. The free layer is trimmed by size D6 to remove the surface damaged portion within it. The pinned layer and bottom electrode stay intact due to their thicker spacer's protection, retaining their original sizes and avoiding any re-deposition. Since the tunnel barrier and pinned layer are larger than the free layer, any remaining damaged portion along the sidewalls of the tunnel barrier and pinned layers does not affect the tunnel barrier and pinned layer's central portions which effectively interact with the free layer and are responsible for device performance.

The trimming step can be an IBE, RIE, or combination process. The trimming step should be configured so that the damaged portion of the free layer is almost horizontally removed. This angle can be adjusted with respect to the feature size and device density. For an IBE trimming process, a large angle from about 30 to 80 degrees from vertical is preferred. For a RIE trimming process, a substantially 0 degree angle from vertical is preferred. A combination IBE and RIE process will use their respective preferred angles.

Since it is of a similar material to the spacer layer, the horizontal hard mask layer 26 is easily removed during the trimming step.

Here it should be noted that we can tune the initial spacer deposition thickness according to the required free layer trimming amount. This is because the former (D2 in FIG. 2) determines the horizontal sidewall coverage thickness after spacer deposition (D3), which determines the remaining horizontal sidewall coverage thickness after spacer etch (D4 in FIG. 3) and after trimming (D5 in FIG. 4), respectively. The RIE and IBE conditions such as power, pressure and gas species during these steps can be adjusted to control the sidewall coverage as well.

The damaged sidewall of the free layer is removed by the trimming process without decreasing the pinned layer size. It also eliminates the problem of re-deposition from the pinned layer and bottom electrode, since these layers are covered by the spacer layer, thus minimizing the problem of current shunting which results in low yield of the MRAM chips. Moreover, this spacer assisted IBE and/or RIE trimming is a self-aligned process without needing photolithography. It therefore avoids overlay challenges when the size goes below sub-nano meter devices. This process is especially useful for MRAM chips of the size smaller than 60 nm as problems associated with damaged sidewall and re-deposition from the bottom electrode become very severe for the smaller sized MRAM chips.

Multiple deposition and etch cycles can be used, if necessary, to ensure that all the sidewall damage as well as sidewall dielectric deposition is removed from the free layer, while some dielectric always stays on the bottom of the MTJ stack to cover the pinned layer.

In summary, a dielectric spacer layer is deposited after the MTJ stack is patterned by either RIE, IBE or a mixed RIE/IBE process. The dielectric layer on the top and bottom of the MTJ patterns is removed during the following etching back process by RIE or IBE, while the dielectric layer on the sidewall is only partially etched away. The top portion of sidewall coverage is gone or thinner than the bottom portion, resulting in a tapered spacer being wider at the bottom next to the pinned layer and narrower at the top next to the free layer. Angle dependent IBE and/or RIE etches the top free layer faster than the bottom pinned layer and the bottom electrode, protected by the tapered spacer, thus ensuring that all the free layer sidewall damage is removed while keeping the pinned layer intact to maintain its high pinning strength for the internal magnetic state and to avoid a shorted device due to re-deposition. The initial spacer deposition thickness can be tuned according to the required free layer trimming amount.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for etching a magnetic tunneling junction (MTJ) structure comprising:
 providing a bottom electrode on a substrate;
 depositing a stack of MTJ layers on said bottom electrode comprising, in order, a pinned layer, a tunnel barrier layer, and a free layer;
 providing a top electrode on said stack of MTJ layers;

patterning said top electrode, said MTJ stack, and said bottom electrode to form a MTJ device wherein sidewall damage is formed on sidewalls of said MTJ device;

conformally depositing a dielectric spacer layer over said substrate and said MTJ device;

etching away said dielectric spacer layer on horizontal surfaces of said substrate and said MTJ device wherein said dielectric spacer layer on sidewalls of said MTJ device is partially etched away to form a tapered spacer wider on said bottom electrode and narrower or absent on said free layer wherein said tapered spacer covers said pinned layer and said bottom electrode; and thereafter removing said sidewall damage from said free layer by applying a horizontal physical etching to said MTJ device wherein said pinned layer and said bottom electrode are protected from said physical etching by said tapered spacer.

2. The method according to claim 1 wherein said MTJ stack is patterned by a chemical, physical, or combination etching process comprising one of: reactive ion etching (RIE), ion beam etching (IBE), or a combination of RIE and IBE.

3. The method according to claim 2 wherein said sidewall damage is formed by said chemical or physical etching process.

4. The method according to claim 2 wherein said sidewall damage is formed after said chemical or physical etching process when said MTJ device is exposed to atmosphere.

5. The method according to claim 1 wherein said dielectric spacer layer comprises hard mask materials.

6. The method according to claim 1 wherein said horizontal physical etching process is an angle dependent RIE, IBE, or combination with an IBE angle from vertical of between about 30 and 80 degrees and a RIE angle from vertical of 0 degrees.

7. The method according to claim 1 wherein said steps of depositing said dielectric spacer layer, etching said dielectric spacer layer; and removing said sidewall damage are repeated as necessary to ensure that all said sidewall damage and all said dielectric spacer layer are removed from said free layer, while some of said dielectric spacer layer covers said pinned layer.

8. A method for etching a magnetic tunneling junction (MTJ) structure comprising:

providing a stack of MTJ layers on a substrate comprising a bottom electrode on a said substrate, a pinned layer, a tunnel barrier layer, a free layer, a top electrode, and a hard mask layer in order on said bottom electrode;

patterning said MTJ stack to form a MTJ device wherein sidewall damage is formed on sidewalls of said MTJ device;

conformally depositing a dielectric spacer layer over said substrate and said MTJ device;

etching away said dielectric spacer layer on horizontal surfaces of said substrate and said MTJ device wherein said dielectric spacer layer on sidewalls of said MTJ device is partially etched away wherein remaining said dielectric spacer layer on said sidewalls of said MTJ device covers said pinned layer and said bottom electrode and wherein remaining said dielectric spacer layer is removed from said free layer or is thinner on said free layer than on said pinned layer and said bottom electrode; and thereafter removing said sidewall damage from said free layer by applying an angle dependent ion beam etching (IBE) to said MTJ device wherein said pinned layer and said bottom electrode are protected from said physical etching by said dielectric spacer layer.

9. The method according to claim 8 wherein said MTJ stack is patterned by a chemical, physical, or combination etching process comprising one of: reactive ion etching (RIE), ion beam etching (IBE), or a combination of RIE and IBE.

10. The method according to claim 9 wherein said sidewall damage is formed by said chemical or physical etching process.

11. The method according to claim 9 wherein said sidewall damage is formed after said chemical or physical etching process when said MTJ device is exposed to atmosphere.

12. The method according to claim 8 wherein said dielectric spacer layer comprises a hard mask material including SiON, SiN, and SiO2.

13. The method according to claim 8 wherein angle dependent IBE has an angle from vertical of between about 30 and 80 degrees.

14. The method according to claim 8 wherein said steps of depositing said dielectric spacer layer, etching said dielectric spacer layer; and removing said sidewall damage are repeated as necessary to ensure that all said sidewall damage and all said dielectric spacer layer are removed from said free layer, while some of said dielectric spacer layer covers said pinned layer.

15. A method for etching a magnetic tunneling junction (MTJ) structure comprising:

providing a stack of MTJ layers on a substrate comprising a bottom electrode on a said substrate, a pinned layer, a tunnel barrier layer, a free layer, a top electrode, and a hard mask layer in order on said bottom electrode;

patterning said MTJ stack to form a MTJ device wherein sidewall damage is formed on sidewalls of said MTJ device;

conformally depositing a dielectric spacer layer over said substrate and said MTJ device;

etching away said dielectric spacer layer on horizontal surfaces of said substrate and said MTJ device wherein said dielectric spacer layer on sidewalls of said MTJ device is partially etched away wherein remaining said dielectric spacer layer on said sidewalls of said MTJ device covers said pinned layer and said bottom electrode and wherein remaining said dielectric spacer layer is removed from said free layer or is thinner on said free layer than on said pinned layer and said bottom electrode; and thereafter removing said sidewall damage from said free layer by applying horizontal physical etching to said MTJ device wherein said pinned layer and said bottom electrode are protected from said physical etching by said dielectric spacer layer.

16. The method according to claim 15 wherein said MTJ stack is patterned by a chemical, physical, or combination etching process comprising one of: reactive ion etching (RIE), ion beam etching (IBE), or a combination of RIE and IBE.

17. The method according to claim 16 wherein said sidewall damage is formed by one or more of: said chemical or physical etching process and by exposure of said MTJ device to atmosphere after said chemical or physical etching process.

18. The method according to claim 15 wherein said dielectric spacer layer comprises a hard mask material including SiON, SiN, and SiO2.

19. The method according to claim 15 wherein said horizontal physical etching process is an angle dependent RIE, IBE, or combination with an IBE angle from vertical of between about 30 and 80 degrees and a RIE angle from vertical of 0 degrees.

20. The method according to claim 15 wherein said steps of depositing said dielectric spacer layer, etching said dielectric spacer layer; and removing said sidewall damage are repeated as necessary to ensure that all said sidewall damage and all said dielectric spacer layer are removed from said free layer, while some of said dielectric spacer layer covers said pinned layer.

\* \* \* \* \*